(12) United States Patent
Lin et al.

(10) Patent No.: US 12,080,582 B2
(45) Date of Patent: *Sep. 3, 2024

(54) ETCHING APPARATUS AND METHODS OF CLEANING THEREOF

(71) Applicant: TAIWAN SEMICONDUCTOR MANUFACTURING COMPANY, LTD., Hsinchu (TW)

(72) Inventors: Yu-Chi Lin, Hsinchu (TW); Huai-Tei Yang, Hsinchu (TW); Lun-Kuang Tan, Hsinchu (TW); Wei-Jen Lo, Hsinchu (TW); Chih-Teng Liao, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 148 days.

This patent is subject to a terminal disclaimer.

(21) Appl. No.: 17/572,351

(22) Filed: Jan. 10, 2022

(65) Prior Publication Data

US 2022/0130706 A1    Apr. 28, 2022

Related U.S. Application Data

(63) Continuation of application No. 16/837,938, filed on Apr. 1, 2020, now Pat. No. 11,222,805.

(51) Int. Cl.
*H01L 21/68*    (2006.01)
*H01J 37/32*    (2006.01)
(Continued)

(52) U.S. Cl.
CPC .... *H01L 21/6833* (2013.01); *H01J 37/32082* (2013.01); *H01J 37/32743* (2013.01);
(Continued)

(58) Field of Classification Search
CPC ............. H01L 21/6833; H01L 21/3065; H01L 21/6831; H01L 21/67069; H01J 37/32082;
(Continued)

(56) References Cited

U.S. PATENT DOCUMENTS 5,507,874 A    4/1996   Su et al.
5,746,928 A *  5/1998   Yen ..................... H01L 21/6833
                                                    134/1.1

(Continued)

FOREIGN PATENT DOCUMENTS

KR          100690136 B1     3/2007

OTHER PUBLICATIONS

Non-Final Office Action issued in U.S. Appl. No. 16/837,938, dated Mar. 3, 2021.
(Continued)

*Primary Examiner* — Duy Vu N Deo
(74) *Attorney, Agent, or Firm* — STUDEBAKER & BRACKETT PC

(57) ABSTRACT

A method for cleaning debris and contamination from an etching apparatus is provided. The etching apparatus includes a process chamber, a source of radio frequency power, an electrostatic chuck within the process chamber, a chuck electrode, and a source of DC power connected to the chuck electrode. The method of cleaning includes placing a substrate on a surface of the electrostatic chuck, applying a plasma to the substrate, thereby creating a positively charged surface on the surface of the substrate, applying a negative voltage or a radio frequency pulse to the electrode chuck, thereby making debris particles and/or contaminants from the surface of the electrostatic chuck negatively charged and causing them to attach to the positively charged surface of the substrate, and removing the substrate from the etching
(Continued)

apparatus thereby removing the debris particles and/or contaminants from the etching apparatus.

20 Claims, 5 Drawing Sheets

(51) Int. Cl.
*H01L 21/3065* (2006.01)
*H01L 21/683* (2006.01)
(52) U.S. Cl.
CPC .. *H01L 21/3065* (2013.01); *H01J 2237/0225* (2013.01); *H01J 2237/182* (2013.01)
(58) Field of Classification Search
CPC ......... H01J 37/32743; H01J 2237/0225; H01J 2237/182; H01J 37/32871; H01J 2237/334
USPC ..................................... 216/67; 438/706–714
See application file for complete search history.

(56) References Cited

U.S. PATENT DOCUMENTS

| | | | |
|---|---|---|---|
| 6,423,175 | B1 | 7/2002 | Huang et al. |
| 7,004,180 | B2 * | 2/2006 | Akiba ....................... B08B 7/00 |
| | | | 134/34 |
| 7,276,447 | B1 | 10/2007 | Delgadino et al. |
| 8,083,963 | B2 | 12/2011 | Delgadino et al. |
| 8,454,758 | B2 | 6/2013 | Akiba |
| 11,222,805 | B2 * | 1/2022 | Lin ..................... H01L 21/6833 |
| 2009/0250077 | A1 * | 10/2009 | Harano ............. H01L 21/02096 |
| | | | 134/1 |
| 2012/0252141 | A1 | 10/2012 | Sundararajan et al. |
| 2015/0200124 | A1 | 7/2015 | Yamamoto |
| 2015/0294843 | A1 | 10/2015 | Chen et al. |
| 2016/0181117 | A1 | 6/2016 | Arghavani et al. |

OTHER PUBLICATIONS

Notice of Allowance issued in U.S. Appl. No. 16/837,938, dated Sep. 7, 2021.

* cited by examiner

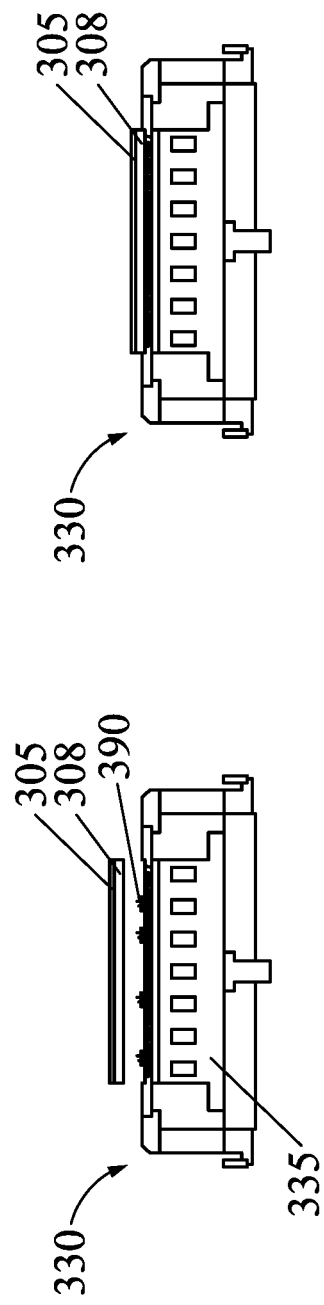
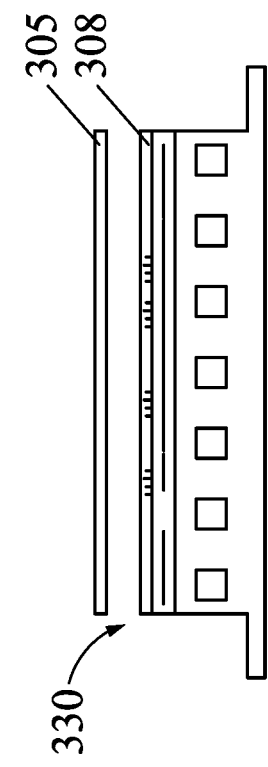
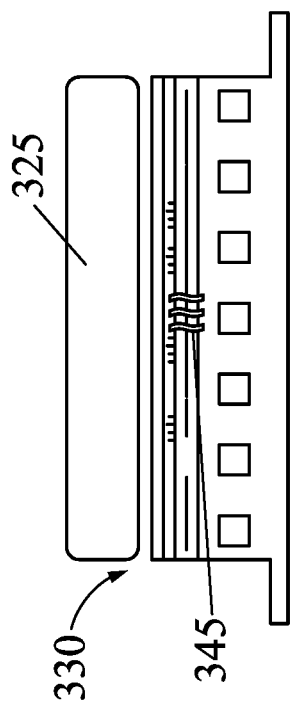
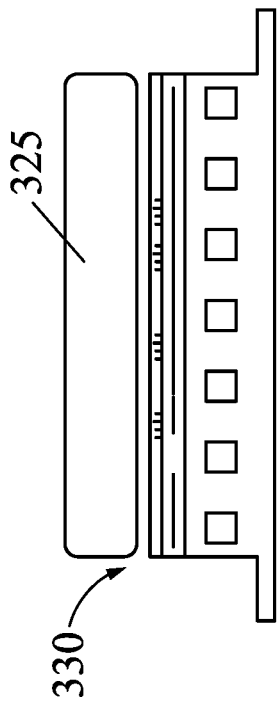
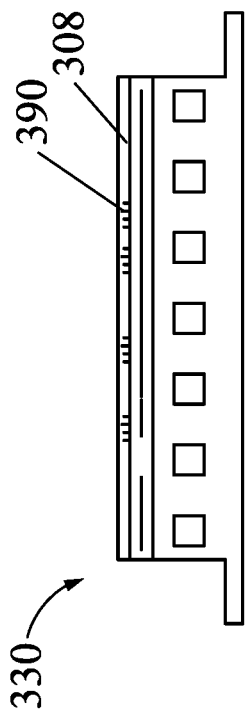
Figure 3A
Figure 3B
Figure 3C
Figure 3D
Figure 3E
Figure 3F

ETCHING APPARATUS AND METHODS OF CLEANING THEREOF

CROSS-REFERENCE TO RELATED APPLICATIONS

This application is a continuation of application Ser. No. 16/837,938 filed on Apr. 1, 2020, now U.S. Pat. No. 11,222,805, the entire disclosure of which is incorporated herein by reference.

BACKGROUND

In semiconductor device manufacturing, various types of plasma processes are used to deposit layers of conductive and dielectric material on semiconductor substrates, and also to blanket etch and selectively etch materials from the substrate. During these processes, the substrate is affixed to a substrate chuck in a process chamber and a plasma generated adjacent the substrate surface. Various techniques have evolved to affix the substrate to the substrate chuck. For example, an electrostatic chuck (ESC) can be used to hold the substrate during the plasma processes. The use of an electrostatic chuck eliminates the need for mechanical clamp rings, and greatly reduces the probability of forming particles by abrasion etc., which particles cause yield problems and require frequent cleaning of the apparatus.

Even though the use of an electrostatic chuck reduces particle contamination, it may be inevitable that small debris particles are formed, and other contamination is generated within the process chamber. These particles and contamination when deposited or formed on the substrate chuck surface of an ESC increase the leakage of the heat transfer gas, i.e. He, at the interface of the chuck surface and substrate. This leakage reduces the temperature control of the substrate and the efficiency of substrate cooling techniques. Consequently, the process chamber and the substrate chuck must be cleaned quite frequently. This results in down time for the apparatus, and requires an expensive and time consuming manual apparatus cleaning operation. Therefore, there is a need for improving the cleaning process without substantial down time for the apparatus.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3A, 3B, 3C, 3D, 3E, and 3F illustrate various schematic views of an electrostatic chuck during a cleaning operation of the electrostatic chuck according to an embodiment of the disclosure.

DETAILED DESCRIPTION

Figure 1:
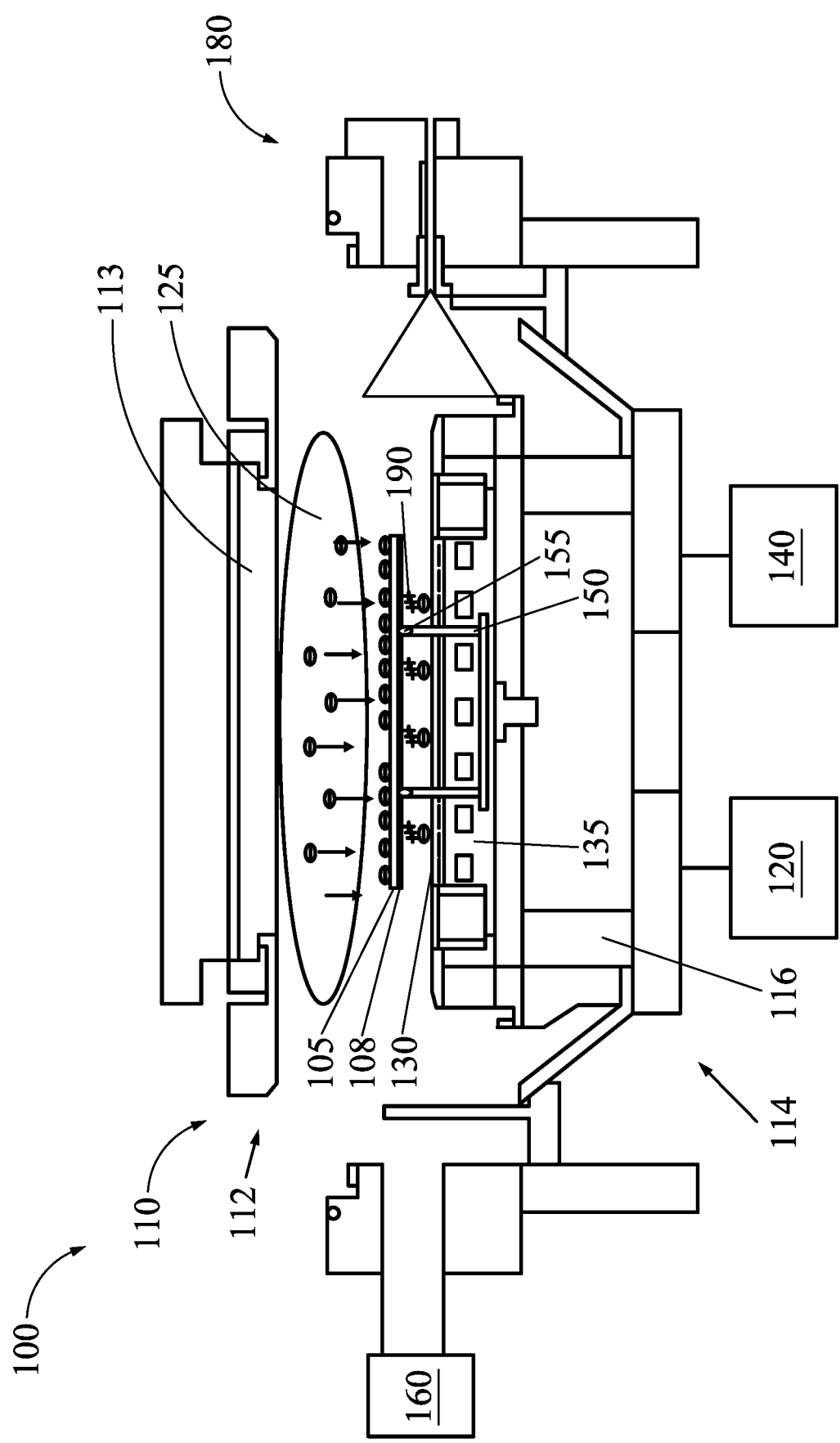
FIG. 1 is a schematic view of an etching apparatus according to an embodiment of the disclosure.

It is to be understood that the following disclosure provides many different embodiments, or examples, for implementing different features of the disclosure. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

The technologies disclosed herein relate to an etching apparatus and methods of cleaning the etching apparatus. The technologies described herein also relate to a plasma etching apparatus that can be configured for self-cleaning. The apparatus and the methods described in various embodiments as disclosed herein improve routine apparatus cleaning operations and decrease down time for the apparatus. For example, the apparatus and the methods described herein help clean small debris particles that are formed during operation of semiconductor process chambers, and various other contamination generated within the process chambers. The dirt particles and contamination that are deposited or formed, for example, on a substrate chuck surface can negatively affect the temperature control of the substrate and the efficiency of substrate cooling techniques. The disclosed apparatus and the methods help with the removal of the dirt particles and contamination, which helps maintain proper temperature control of the substrate and efficient of substrate cooling. In accordance with various embodiments disclosed herein, the removal process of dirt particles and contamination are achieved via an application of a negative voltage or radio frequency (RF) pulses to, for example, an electrode chuck. In some embodiments, the application of negative voltage or radio frequency pulses makes the debris particles and/or contaminants negatively charged, causing the debris particles and/or contaminants to attach to a positively charged surface of a substrate disposed nearby. In some embodiments, a backside of a dummy substrate can be treated with an adhesive coating and the debris particles and/or contaminants become physically attached the adhesive coating.

FIG. 1 is a schematic view of an etching apparatus 100, according to an embodiment of the disclosure. As shown in FIG. 1, the etching apparatus 100 includes a process chamber 110, and a source of radio frequency (RF) power 120 configured to provide radio frequency power in the process chamber 110. The etching apparatus 100 also includes an electrostatic chuck 130 within the process chamber 110, and the electrostatic chuck 130 is configured to receive a substrate 105. In accordance with various embodiments, the substrate 105 includes a wafer, silicon substrate, or any other wafer or substrate. The etching apparatus 100 also includes a chuck electrode 135, and a source of direct current (DC) power 140 connected to the chuck electrode 135. The source of DC power 140 is configured to provide power to the chuck electrode 135.

In some embodiments, the etching apparatus 100 is a plasma etching apparatus. In some embodiments, the etching apparatus 100 is any plasma etching or dry etching tool that produces a plasma from a process gas, typically oxygen, chlorine-bearing gas, or fluorine-bearing gas, and uses a radio frequency electric field. In some embodiments, the etching apparatus 100 is an ion-beam etcher, reactive ion etcher, or the like. In other embodiments, instead of an etching apparatus, a plasma deposition apparatus is used.

In some embodiments, the substrate 105 is a semiconductor substrate. In some embodiments, the substrate 105 is a dummy substrate, for example, used for cleaning or removing debris particles and/or contaminants from the etching apparatus 100. In some embodiments, debris particles and/or contaminants include, for example but not limited to, Cu, Al, Ni, Ti, O, F, Si Cu, Al, Ge, Ni, Ti, W, Xi, Mo, Fe, Pb, Bi, In, $Si_xO_y$, $Al_xO_y$, and $Ti_xO_y$. In some embodiments, a backside of the substrate 105 includes a coating (or a film) 108 that adheres the debris particles and/or contaminants. In some embodiments, the coating 108 includes an oxide film, an organic film, or a metal film containing silicon oxide or titanium nitride, including, for example, but not limited to, $Si_xO_y$ and $Ti_xN_y$.

In some embodiments, the substrate 105 includes a single crystalline semiconductor layer on at least its surface. In some embodiments, the substrate 105 includes a single crystalline semiconductor material such as, but not limited to Si, Ge, SiGe, GaAs, InSb, GaP, GaSb, InAlAs, InGaAs, GaSbP, GaAsSb, and InP. In some embodiments, the substrate 105 is made of Si. In some embodiments, the substrate 105 is a silicon substrate. In some embodiments, the substrate 105 is a semiconductor-on-insulator substrate fabricated using separation by implantation of oxygen (SIMOX), substrate bonding, and/or other suitable methods, such as a silicon-on-insulator (SOI) substrate, a silicon germanium-on-insulator (SGOI) substrate, or a germanium-on-insulator (GOI) substrate. In some embodiments, the substrate 105 is a Si substrate having a mirror polished surface on one side or both sides.

In some embodiments, the process chamber 110 includes an upper portion 112 and a lower portion 114, which are made of a conductive material, such as aluminum. The upper portion 112 includes an upper electrode 113 in some embodiments. In some embodiments, the lower portion 114 includes an insulating ceramic frame 116 and includes the electrostatic chuck 130 within the insulating ceramic frame 116. For example, the electrostatic chuck 130 is disposed within the insulating ceramic frame 116 within the lower portion 114 of the process chamber 110, as shown in FIG. 1. In some embodiments, the electrostatic chuck 130 includes a conductive sheet, which serves as the chuck electrode 135. As shown in FIG. 1, the chuck electrode 135 is connected to the source of DC power 140. When a DC voltage from the source of DC power 140 is applied to the chuck electrode 135 of the electrostatic chuck 130 having the substrate 105 disposed thereon, a Coulomb force is generated between the substrate 105 and the chuck electrode 135. The Coulomb force attracts and holds the substrate 105 on the electrostatic chuck 130 until the application of the DC voltage from the source of DC power 140 is discontinued.

In some embodiments, in order to improve the heat transfer between the substrate 105 and the electrostatic chuck 130, one or more gases, such as He or Ar, is introduced between the substrate 105 and the electrostatic chuck 130. In some embodiments, the gas dissipates heat generated between the substrate 105 and the electrostatic chuck 130 during the application of the DC voltage.

As illustrated in FIG. 1, the etching apparatus 100 also includes a pump 160 connected to the process chamber 110. The pump 160 is configured to provide a vacuum or maintain a certain gas pressure within the process chamber 110. In some embodiments, the pressure within the process chamber 110 is maintained by the combination of the gas or gases being introduced and a level of pumping performed by the pump 160. In some embodiments, the pressure within the process chamber 110 is maintained solely by pumping with the pump 160.

In some embodiments, the electrostatic chuck 130 of the etching apparatus 100 also includes a plurality of pins 150 disposed in the electrostatic chuck 130. In some embodiments, each of the plurality of pins 150 includes an electrically insulated cap 155 to electrically insulate a sample, e.g., the substrate 105, from a main rod of the pin 150. In some embodiments, the plurality of pins 150 are configured to move up the substrate 105 a distance of about 1 mm to about 10 mm away from the surface of the electrostatic chuck 130, and move down to place the substrate on the electrostatic chuck 130. In some embodiments, the distance of about 1 mm to about 10 mm provides effective cleaning of the electrostatic chuck 130.

In some embodiments, the source of radio frequency power 120 is turned on to apply a plasma 125 for plasma etching operations. In some embodiments, the source of radio frequency power 120 (e.g., 13.56 MHz, 2.45 GHz, etc.) is turned on to create a positively charged surface on a surface of the substrate 105. In some embodiments, an application of a radio frequency pulse from the source of radio frequency power 120 in the process chamber 110 makes the debris particles and/or contaminants 190 on, and/or in proximity, of the surface of the electrostatic chuck 130 negatively charged. In some embodiments, during a cleaning operation, the source of radio frequency power 120 is configured to apply the radio frequency pulse of about 10% to about 90% of the power applied during normal etching operations. In some embodiments, the source of radio frequency power 120 is configured to apply the radio frequency pulse of about 20% to about 80%, about 30% to about 70%, or about 30% to about 50% of the power applied during normal etching operations. In some embodiments, operating at a power higher about 80% of the normal etching power results in the electrode chuck being etched. In some embodiments, operating at a power lower than about 20% of the normal etching power results in inadequate removal of the dirt particles and/or contaminants. In some embodiments, the power applied during the etching operations ranges from about 200 watts to about 700 watts. The application of the radio frequency power creates the positively charged surface on the surface of the substrate 105. In some embodiments, the application of the radio frequency pulse occurs for a duration of about 10 seconds to about 60 seconds, about 10 seconds to about 50 seconds, about 20 seconds to about 40 seconds, or about 20 seconds to about 30 seconds, inclusive of any duration of time therebetween.

In some embodiments, the application of the radio frequency pulse for shorter than 10 seconds will not be enough time to create negative charges. In some embodiments, the application of the radio frequency pulse for longer than 60 seconds causes charge saturation.

In some embodiments, the application of the DC voltage (e.g. a negative voltage) from the source of DC power 140 to the electrode chuck 130 makes the debris particles and/or contaminants 190 on, and/or in proximity, of the surface of the electrostatic chuck 130 negatively charged. In some embodiments, the source of DC power 140 is configured to apply the DC voltage of about 10% to about 90% of the power applied during normal etching operations using direct current. In some embodiments, the source of DC power 140 is configured to apply the DC voltage of about 20% to about 80%, about 30% to about 70%, or about 30% to about 50% of the power applied during normal etching operations using direct current. The applied DC voltage ranges from about 2000 volts to about 2500 volts in some embodiments. The application of the DC power creates the positively charged surface on the surface of the substrate 105. In some embodiments, the application of the DC voltage occurs for a duration of about 10 seconds to about 60 seconds, about 10 seconds to about 50 seconds, about 20 seconds to about 40 seconds, or about 20 seconds to about 30 seconds, inclusive of any duration of time therebetween. With application of either the DC (negative) voltage or the radio frequency pulse, the negatively charged debris particles and/or contaminants 190 are attached to the positively charged surface of the substrate 105.

As illustrated in FIG. 1, the etching apparatus 100 also includes a spectral and/or charge monitoring system 180. The spectral and/or charge monitoring system 180 is configured to monitor surface charge level and/or composition of debris particles and/or contaminants 180 on a surface of the electrostatic chuck 130. The spectral and/or charge monitoring system 180 uses x-rays or an ion beam to charge the debris particles and/or contaminants 180, including any by-products. For example, during a cleaning operation of the etching apparatus 100, the spectral and/or charge monitoring system 180 is configured to continuously or periodically monitor surface charge level and/or composition of debris particles and/or contaminants 180. In some embodiments, continuous or periodic monitoring by the spectral and/or charge monitoring system 180 provides a user with a contamination history or profile of the etching apparatus 100 throughout the etching apparatus's service life, or in some instances, any time period of the etching apparatus's service life.

Figure 2:
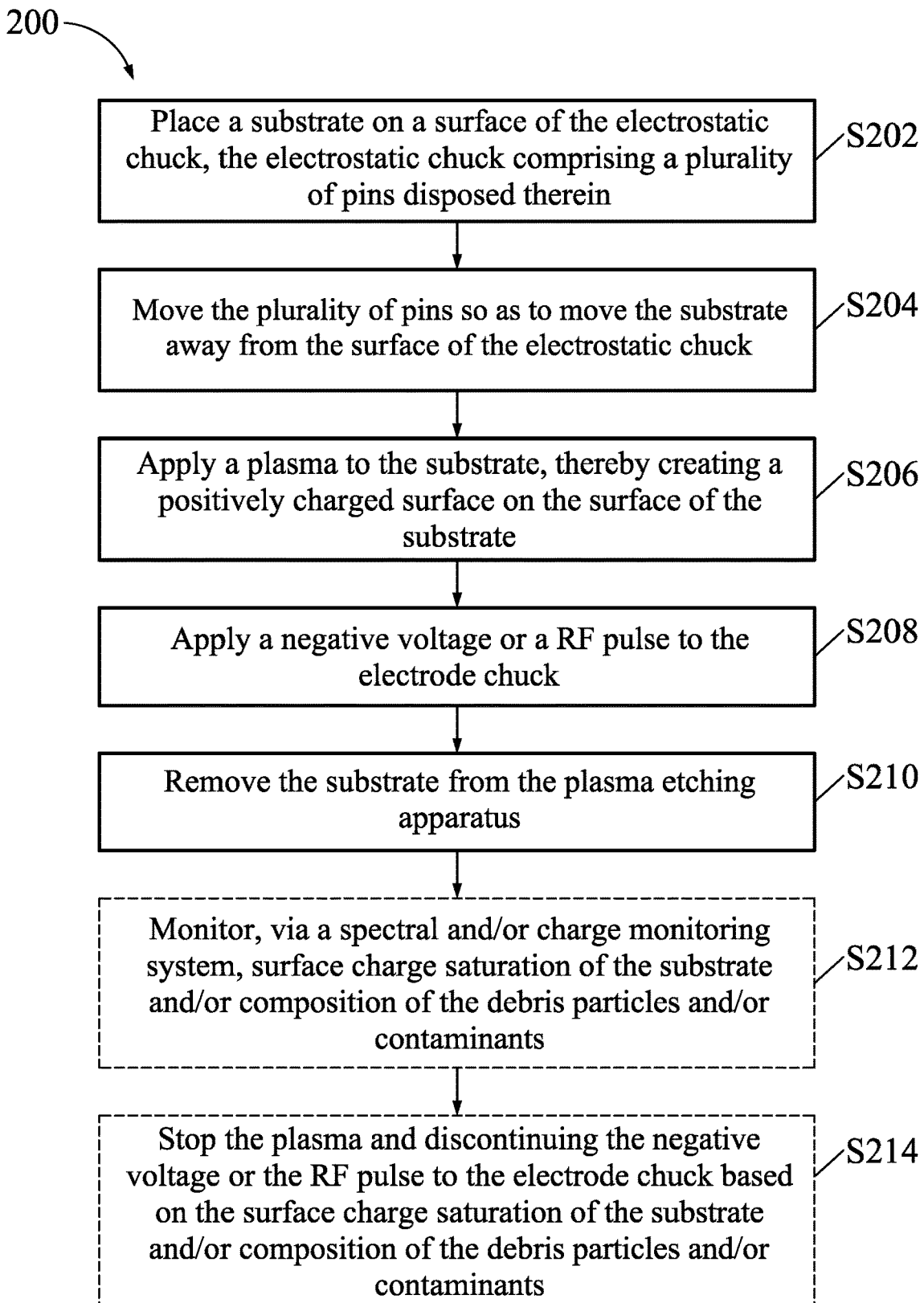
FIG. 2 is a flow chart illustrating a method of cleaning an etching apparatus according to an embodiment of the disclosure.

FIG. 2 is a flow chart illustrating a method 200 of cleaning an etching apparatus, according to an embodiment of the disclosure. It is understood that additional operations can be provided before, during, and after the operations shown in the flow chart of FIG. 2, and some of the operations described below can be replaced or eliminated, for additional embodiments of the method. The order of the operations/processes may be interchangeable. The etching apparatus includes a process chamber, a source of radio frequency power, an electrostatic chuck within the process chamber, a chuck electrode, and a source of DC power connected to the chuck electrode. In some embodiments, the etching apparatus is the etching apparatus 100 as shown and described with respect to FIG. 1. In some embodiments, the cleaning includes removing debris particles and/or contaminants.

As illustrated in FIG. 2, the method 200 includes placing a substrate on a surface of the electrostatic chuck at operation S202. In some embodiments, the substrate is the substrate 105 as described with respect to FIG. 1. In some embodiments, a backside of the substrate includes a coating that adheres the debris particles and/or contaminants. The coating is similar or substantially similar to the coating (or the film) 108 as described with respect to FIG. 1. The electrostatic chuck includes a plurality of pins disposed therein. In some embodiments, the electrostatic chuck is the electrostatic chuck 130 and the plurality of pins are the plurality of pins 150 as described with respect to FIG. 1.

At operation S204, the method 200 includes moving the plurality of pins 150 so as to move the substrate 105 away from the surface of the electrostatic chuck 130. In some embodiments, each of the plurality of pins 150 includes an electrically insulated cap 155 to electrically insulate the substrate 105 from the electrostatic chuck 130. In some embodiments, moving the plurality of pins 150 includes moving the substrate 105 a distance of about 1 mm to about 10 mm away from the surface of the electrostatic chuck 130.

In some embodiments, instead of operations S202 and S204, the plurality of pins 150 are moved up from the electrostatic chuck 130 before placing the substrate 105 there. After the plurality of pins 150 are moved up to a position away from the electrostatic chuck 130, the substrate 105 is placed on the plurality of pins 150. In some embodiments, the location of the plurality of pins 150 is different from the highest position at which a substrate handler operates.

At operation S206, the method 200 includes applying a plasma to the substrate 105. The applied plasma creates a positively charged surface on the surface of the substrate.

At operation S208, the method 200 includes applying a negative voltage or a radio frequency pulse to the electrode chuck 130. The application of the negative voltage or the radio frequency pulse to the electrode chuck 130 makes debris particles and/or contaminants on, and/or in proximity, of the surface of the electrostatic chuck 130 negatively charged. The negative charges on the debris particles and/or contaminants are attracted to the positively charged surface of the substrate 105, e.g., the backside of the substrate, and subsequently attached to the positively charged surface of the substrate. In some embodiments, the negative (DC) voltage or the radio frequency pulse is applied at about 30% to about 50% of the power applied during a normal etching procedure of the etching apparatus. In some embodiments, the application of the negative voltage or the radio frequency pulse occurs for a duration of about 10 seconds to about 60 seconds.

At operation S210, the method 200 includes removing the substrate 105 from the etching apparatus 100. Since the substrate now includes adhered debris particles and/or contaminants from the etching apparatus, removing the substrate removes the debris particles and/or contaminants from the etching apparatus.

In some embodiments, the etching apparatus includes a spectral and/or charge monitoring system. At operation S212, the method 200 optionally includes monitoring, via the spectral and/or charge monitoring system 180, surface charge saturation of the substrate and/or composition of the debris particles and/or contaminants. In some embodiments, the spectral and/or charge monitoring system 180 uses x-rays or an ion beam to charge the debris particles and/or contaminants 180, including any by-products, and uses a detector, such as, a residual gas analyzer or any relevant chemical analyzer, to analyze the composition of the debris particles and/or contaminants 180, including any by-products.

At operation S214, the method 200 optionally includes stopping the plasma and discontinuing the negative voltage or the radio frequency pulse to the electrode chuck 130 based on the surface charge saturation of the substrate and/or composition of the debris particles and/or contaminants. In some embodiments, the method 200 optionally includes after applying the plasma, venting the etching apparatus to a pressure of greater than about 400 mTorr, and after venting, applying a vacuum to further remove the debris particles and/or contaminants from the electrostatic chuck.

FIGS. 3A, 3B, 3C, 3D, 3E, and 3F illustrate various schematic views of another embodiment of an electrostatic chuck during a cleaning operation of the electrostatic chuck, according to an embodiment of the disclosure. FIG. 3A illustrates an electrostatic chuck 330 that is substantially similar to the electrostatic chuck 130 as described with respect to FIG. 1. As illustrated in FIG. 3A, the electrostatic chuck 330 includes a conductive sheet, which serves as a chuck electrode 335. The electrostatic chuck 330 includes on its surface debris particles and/or contaminants 390 that are to be removed from the electrostatic chuck 330. FIG. 3A shows a substrate 305 with a coating 308 disposed on its surface as illustrated in FIG. 3A. The substrate 305 and the coating 308 are, respectively, the same or substantially similar to the substrate 105 and the coating 108 as described with respect to FIG. 1. In some embodiments, the coating 308 includes a photoresist film.

FIG. 3B is a schematic view illustrating the placement of the substrate 305 onto the electrostatic chuck 330. As illustrated in FIG. 3B, the coating 308 of the substrate 305 is in contact with the electrostatic chuck 330. The coating 308 therefore covers or substantially contacts the debris particles and/or contaminants 390.

FIG. 3C is a schematic view illustrating an application of a plasma 325 to heat the substrate 305. FIG. 3C also illustrates heating the substrate 325 by application of heat 345 in the electrostatic chuck 330. In some embodiments, heating by either the application of the plasma 325 or the heat 345 melts or chemically activates the coating 308. In some embodiments, the heat melts or softens the coating 308, and then after the heat removed, the coating 308 is solidified or hardened.

FIG. 3D is a schematic view illustrating the transfer of the coating 308 from the substrate 305 onto the electrostatic chuck 330 having the debris particles and/or contaminants 390. Due to the heating, the coating 308 detaches from the substrate 305 and attaches to the electrostatic chuck 330, thereby substantially encapsulating the debris particles and/or contaminants 390 between the coating 308 and the electrostatic chuck 330.

FIG. 3E is a schematic view of the electrostatic chuck 330 having the coating 308 attached thereto after the removal of the substrate 305.

FIG. 3F is a schematic view illustrating an additional application of the plasma 325 to remove the coating 308, the debris particles and/or contaminants 390 from the electrostatic chuck 330. In some embodiments, the plasma 325 includes oxygen plasma that removes organic material. When the coating 308 and the debris particles and/or contaminants 390 are organic, the oxygen plasma can remove the coating 308 and the debris particles at the same time. In some embodiments, a plasma gas is used to remove metal contaminants, by recombining the metal contaminants with other debris particles or by-products. For example, the recombination of a metal can be expressed as $Al^{3+}+3NH_3 \cdot H_2O \rightarrow Al(OH)_3 \downarrow + 3NH^{4+}$, where aluminum ion ($Al^{3+}$) is converted into aluminum hydroxide ($Al(OH)_3$) and deposited.

In other embodiments, after the coating 308 is solidified or hardened, the substrate 305 is removed with the coating 308 attached thereto, thereby removing debris/contamination from the surface of the ESC.

Figure 4:
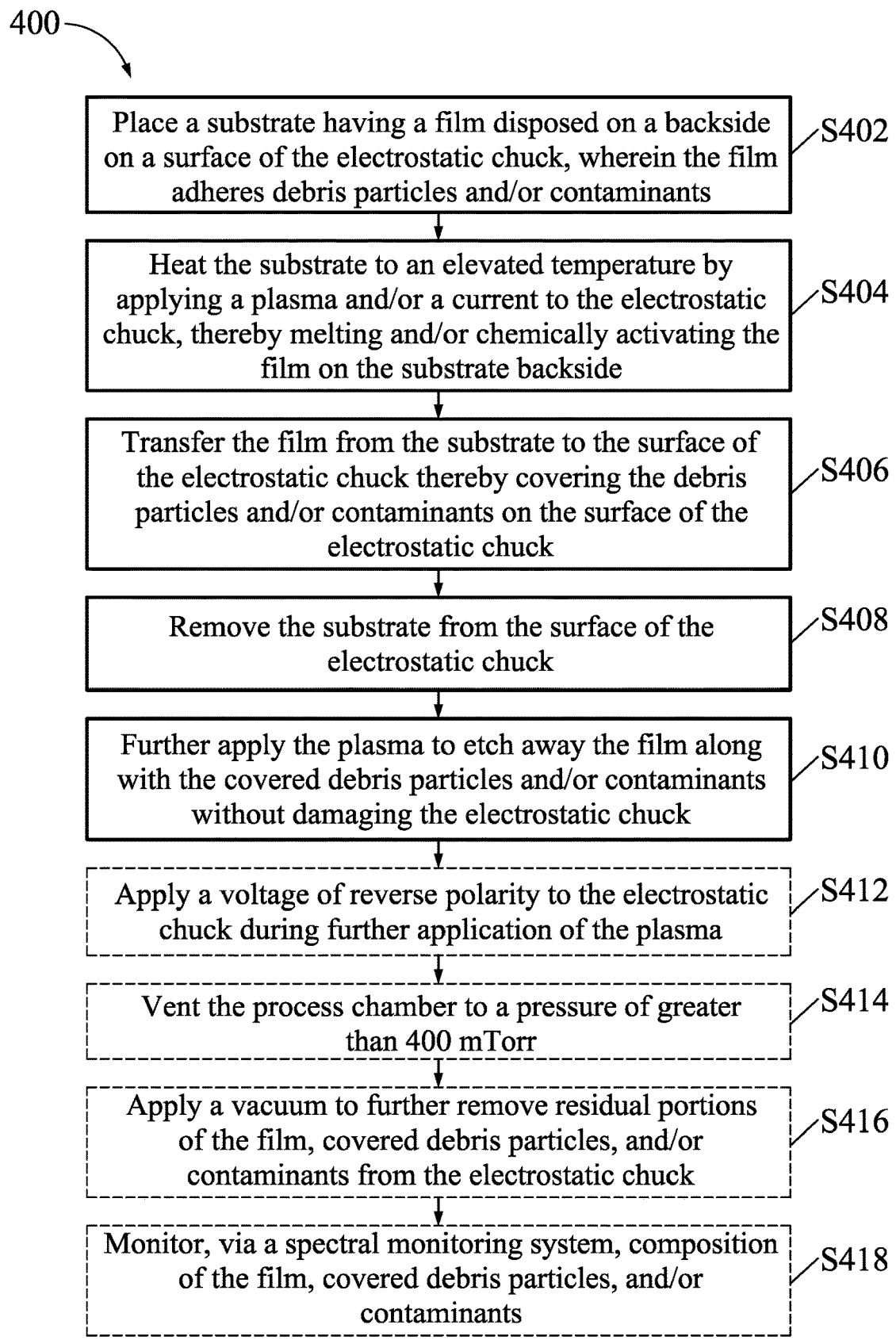
FIG. 4 is another flow chart illustrating a method of cleaning an etching apparatus according to an embodiment of the disclosure.

FIG. 4 is another flow chart illustrating a method 400 of cleaning an etching apparatus having the electrostatic chuck 330, according to an embodiment of the disclosure. In some embodiments, the etching apparatus is the etching apparatus 100 as shown and described with respect to FIG. 1. In some embodiments, the etching apparatus includes a spectral monitoring system. The method 400 includes placing a substrate 305 having a film (or a coating) disposed on a backside on a surface of the electrostatic chuck 330 at operation S402. In some embodiments, the substrate 305 is the substrate 105 as described with respect to FIG. 1. In some embodiments, the film adheres debris particles and/or contaminants.

At operation S404, the method 400 includes heating the substrate 305 to an elevated temperature by applying a plasma and/or a current to the electrostatic chuck 330. The heat generated by the plasma or the current, e.g., direct current, melts and/or chemically activates the film 308 on the substrate backside.

At operation S406, the method 400 includes transferring the film 308 from the substrate 305 to the surface of the electrostatic chuck 330. The transfer of the film onto the surface of the electrostatic chuck 330 covers the debris particles and/or contaminants on the surface of the electrostatic chuck.

At operation S408, the method 400 includes removing the substrate 305 from the surface of the electrostatic chuck 330.

At operation S410, after the removal of the substrate from the surface of the electrostatic chuck 330, the method 400 includes applying the plasma to etch away the film along with the covered debris particles and/or contaminants, in some embodiments, without damaging the electrostatic chuck 330. The application of the plasma substantially or completely removes the film and/or covered debris particles and/or contaminants. In some embodiments, the density of the plasma for heating the substrate is lower than the plasma density for etching away the film and/or covered debris particles and/or contaminants. In some embodiments, the temperature of the electrostatic chuck 330 during the heating of the backside treated substrate is higher than temperature of the film.

At operation S412, the method 400 optionally includes applying a voltage of reverse polarity to the electrostatic chuck during further application of the plasma. In some embodiments, the application of the voltage of reverse polarity enhances transfer and removal of the contaminant particles from the electrostatic chuck 330.

At operation S414, the method 400 optionally includes venting the etching apparatus to a pressure of greater than about 400 mTorr. In some embodiments, the venting to a pressure of greater than about 400 mTorr occurs after operation S410, e.g, after further applying the plasma.

After the etching apparatus is vented to a pressure of greater than about 400 mTorr, the method 400 optionally includes applying a vacuum to further remove residual portions of the film, covered debris particles, and/or contaminants from the electrostatic chuck 330, at operation S416.

At operation S418, the method 400 optionally includes monitoring, via the spectral monitoring system, the composition of the film, covered debris particles, and/or contaminants.

Figure 5:
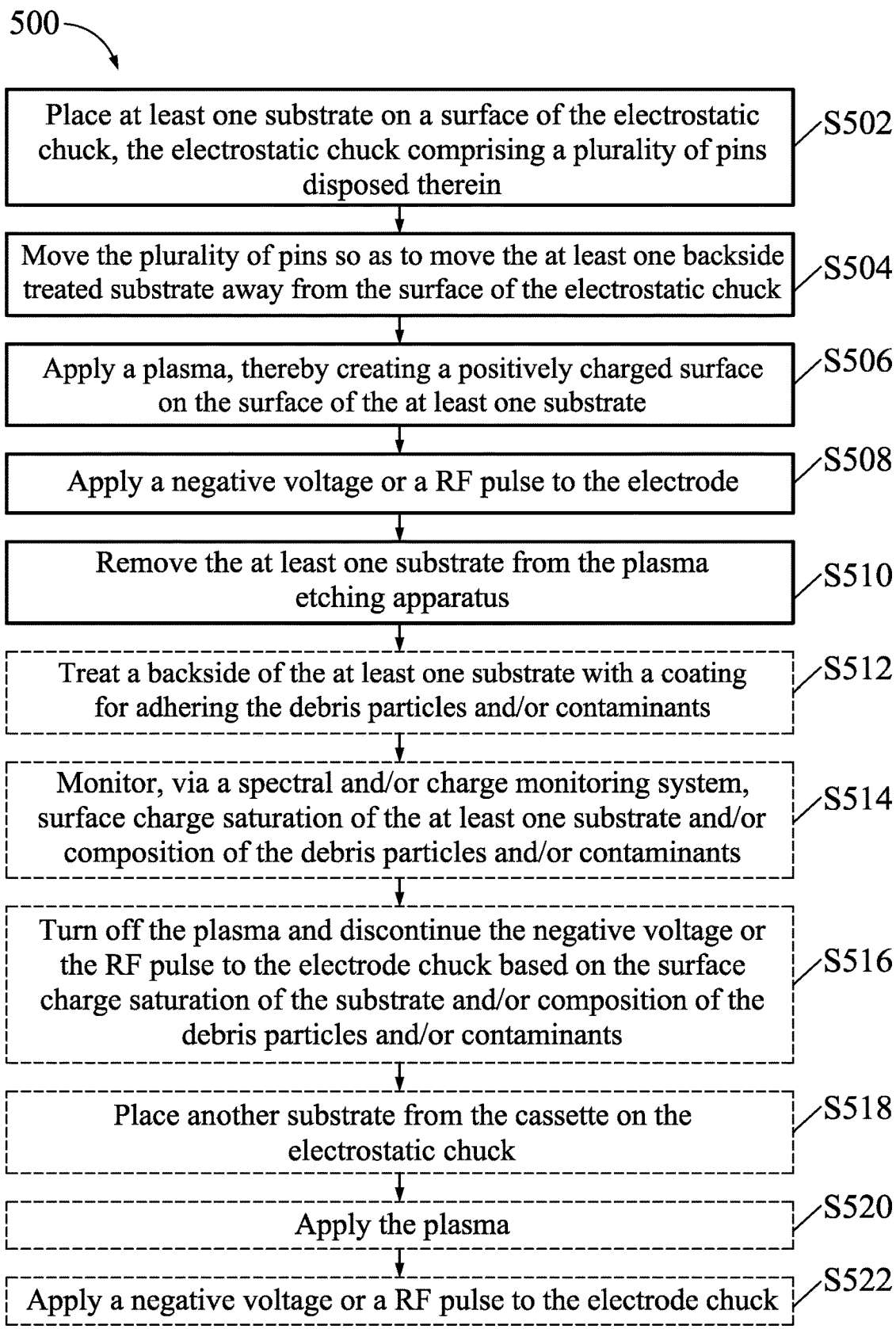
FIG. 5 is another flow chart illustrating a method of cleaning an etching apparatus according to an embodiment of the disclosure.

FIG. 5 is another flow chart illustrating a method 500 of cleaning an etching apparatus, according to an embodiment of the disclosure. The etching apparatus includes a process chamber, a cassette containing at least one substrate, a source of radio frequency power, an electrostatic chuck within the process chamber, a chuck electrode, and a source of DC power connected to the chuck electrode. In some embodiments, the etching apparatus is the etching apparatus 100 as shown and described with respect to FIG. 1. In some embodiments, the cleaning includes removing debris particles and/or contaminants.

As illustrated in FIG. 5, the method 500 includes placing at least one substrate on a surface of the electrostatic chuck at operation S502. In some embodiments, at least one substrate is the substrate 105 as described with respect to FIG. 1. In some embodiments, at least one substrate has a treated backside surface. The electrostatic chuck includes a plurality of pins disposed therein. In some embodiments, the electrostatic chuck is the electrostatic chuck 130 and the plurality of pins are the plurality of pins 150 as described with respect to FIG. 1. In some embodiments, each of the plurality of pins includes an electrically insulated cap to electrically insulate the substrate from the electrostatic chuck.

At operation S504, the method 500 includes moving the plurality of pins so as to move at least one backside treated substrate away from the surface of the electrostatic chuck. In some embodiments, moving the plurality of pins includes moving the substrate a distance of about 1 mm to about 10 mm away from the surface of the electrostatic chuck.

At operation S506, the method 500 includes applying a plasma. The plasma creates a positively charged surface on the surface of at least one substrate.

At operation S508, the method 500 includes applying a negative voltage or a radio frequency pulse to the electrode chuck. The application of the negative voltage or the radio frequency pulse to the electrode chuck makes debris particles and/or contaminants on, and/or in proximity, of the surface of the electrostatic chuck negatively charged. The negative charges on the debris particles and/or contaminants cause the debris particles and/or contaminants to attach to the positively charged surface of at least one substrate. In some embodiments, the negative (e.g., DC) voltage or the radio frequency pulse is applied at about 30% to about 50% of power applied during a normal etching procedure of the etching apparatus. In some embodiments, applying the negative voltage or the radio frequency pulse to the electrode chuck includes applying the power for a duration of about 10 seconds to about 60 seconds.

At operation S510, the method 500 includes removing at least one substrate from the etching apparatus thereby removing the debris particles and/or contaminants from the etching apparatus.

At operation S512, the method 500 optionally includes treating a backside of at least one substrate with a coating for adhering the debris particles and/or contaminants. The coating is similar or substantially similar to the coating (or the film) 108 as described with respect to FIG. 1.

In some embodiments, the etching apparatus includes a spectral and/or charge monitoring system. At operation S514, the method 500 optionally includes monitoring, via the spectral and/or charge monitoring system, surface charge saturation of at least one substrate and/or composition of the debris particles and/or contaminants.

At operation S516, the method 500 optionally includes turning off the plasma and discontinuing the negative voltage or the radio frequency pulse to the electrode chuck based on the surface charge saturation of the substrate and/or composition of the debris particles and/or contaminants.

At operation S518, the method 500 optionally includes placing another substrate from the cassette on the electrostatic chuck.

At operation S520, the method 500 optionally includes turning on the plasma, thereby creating a positively charged surface on a surface of a second substrate.

At operation S522, the method 500 optionally includes applying a negative voltage or a radio frequency pulse to the electrode chuck. The negative voltage or the radio frequency pulse makes residual debris particles and/or contaminants on, and/or in proximity, of the surface of the electrostatic chuck negatively charged. The negative charges on the residual debris particles and/or contaminants cause the residual debris particles and/or contaminants to attach to the positively charged surface of the second substrate. In some embodiments, the negative voltage or the radio frequency pulse is applied at about 30% to about 50% of the power that is normally applied during normal etching operations of the etching apparatus. In some embodiments, applying the negative voltage or the radio frequency pulse to the electrode chuck includes applying the power for a duration of about 10 seconds to about 60 seconds.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

The technologies disclosed herein relate to an etching apparatus and methods of cleaning the etching apparatus. Embodiments described herein provide improved cleaning operations of etching apparatus and reduced etching apparatus down time for cleaning. In addition, because of the improved contaminant removal from the etching apparatus, contamination of workpieces is reduced and device yield is improved in embodiments of the disclosure.

An embodiment of the disclosure is a method for cleaning debris and contamination. The method includes providing an etching apparatus that includes a process chamber, a source of radio frequency power, an electrostatic chuck within the process chamber, a chuck electrode, and a source of DC power connected to the chuck electrode. The method of cleaning includes placing a substrate on a surface of the electrostatic chuck, the electrostatic chuck including a plurality of pins disposed therein. The method also includes moving the plurality of pins so as to move the substrate away from the surface of the electrostatic chuck. The method also includes applying a plasma to the substrate, thereby creating a positively charged surface on the surface of the substrate. The method also includes applying a negative voltage or a radio frequency pulse to the electrode chuck. The application of the negative voltage or the radio frequency pulse to the electrode chuck makes debris particles and/or contaminants on, and/or in proximity, of the surface of the electrostatic chuck negatively charged, causing the debris particles and/or contaminants to attach to the positively charged surface of the substrate. The method also includes removing the substrate from the etching apparatus thereby removing the debris particles and/or contaminants from the etching apparatus. In an embodiment, the applying the negative voltage or the radio frequency pulse to the electrode chuck includes applying 30% to 50% of power applied during a normal etching procedure of the etching apparatus. In an embodiment, applying the negative voltage or the radio frequency pulse to the electrode chuck includes applying the power for a duration of about 10 seconds to about 60 seconds. In an embodiment, each of the plurality of pins includes an electrically insulated cap to electrically insulate the substrate from the electrostatic chuck. In an embodiment, moving the plurality of pins includes moving the substrate a distance of about 1 mm to about 10 mm away from the surface of the electrostatic chuck. In an embodiment, a backside of the substrate comprises a coating that adheres the debris particles and/or contaminants. In an embodiment, the etching apparatus includes a spectral and/or charge monitoring system. In an embodiment, the method further includes monitoring, via the spectral and/or charge monitoring system, surface charge saturation of the substrate and/or composition of the debris particles and/or contaminants. In an embodiment, the method further includes stopping the plasma and discontinuing the negative voltage or the radio frequency pulse to the electrode chuck based on the surface charge saturation of the substrate and/or composition of the debris particles and/or contaminants. In an embodiment, the method further includes after applying the plasma, venting the etching apparatus to a pressure of greater than about 400 mTorr, and after venting, applying a vacuum to further remove the debris particles and/or contaminants from the electrostatic chuck.

Another embodiment of the disclosure is a method for cleaning an etching apparatus. The method includes placing a substrate having a film disposed on a backside on a surface of the electrostatic chuck. The film adheres debris particles and/or contaminants. The method also includes heating the substrate to an elevated temperature by applying a plasma and/or a current to the electrostatic chuck, thereby melting and/or chemically activating the film on the substrate backside, transferring the film from the substrate to the surface of the electrostatic chuck thereby covering the debris particles and/or contaminants on the surface of the electrostatic chuck, removing the substrate from the surface of the electrostatic chuck, and further applying the plasma to etch away the film along with the covered debris particles and/or contaminants. In an embodiment, the density of the plasma for heating the substrate is lower than the plasma for etching away the film. In an embodiment, temperature of the electrostatic chuck during the heating of the backside treated substrate is higher than temperature of the film. In an embodiment, the method further includes applying a voltage of reverse polarity to the electrostatic chuck during further application of the plasma. In an embodiment, the method further includes, after further applying the plasma, venting the etching apparatus to a pressure of greater than about 400 mTorr, and after venting, applying a vacuum to further remove residual portions of the film, covered debris particles and/or contaminants from the electrostatic chuck. In an embodiment, the electrostatic chuck includes a plurality of pins disposed therein and each of the plurality of pins includes an electrically insulated cap to electrically insulate the substrate from the electrostatic chuck. In an embodiment, the etching apparatus includes a spectral monitoring system. In an embodiment, the method further includes monitoring, via the spectral monitoring system, composition of the film, covered debris particles and/or contaminants.

Another embodiment of the disclosure is an etching apparatus. The etching apparatus includes a process chamber, a source of radio frequency power, an electrostatic chuck within the process chamber, the electrostatic chuck configured to receive a substrate, a chuck electrode, a source of DC power connected to the chuck electrode, and a spectral and/or charge monitoring system. The spectral and/or charge monitoring system is configured to monitor surface charge level and/or composition of debris particles and/or contaminants on a surface of the electrostatic chuck. In an embodiment, the electrostatic chuck of the etching apparatus includes a plurality of pins disposed therein. In an embodiment, each of the plurality of pins includes an electrically insulated cap to electrically insulate the substrate from the electrostatic chuck. In an embodiment, the plurality of pins are configured to move the substrate a distance of about 1 mm to about 10 mm away from the surface of the electrostatic chuck.

Another embodiment of the disclosure is a method for cleaning an etching apparatus. The etching apparatus includes a process chamber, a cassette containing at least one substrate, a source of radio frequency power, an electrostatic chuck within the process chamber, a chuck electrode, and a source of DC power connected to the chuck electrode. The method of cleaning includes placing the at least one substrate on a surface of the electrostatic chuck, the electrostatic chuck comprising a plurality of pins disposed therein. The plurality of pins are moved so as to move the at least one backside treated substrate away from the surface of the electrostatic chuck, applying a plasma, thereby creating a positively charged surface on the surface of the at least one substrate. A negative voltage or a radio frequency pulse is applied to the electrode chuck, thereby making debris particles and/or contaminants on, and/or in proximity, of the surface of the electrostatic chuck negatively charged and causing the debris particles and/or contaminants to attach to the positively charged surface of the at least one substrate, and removing the at least one substrate from the etching apparatus thereby removing the debris particles and/or contaminants from the etching apparatus. In an embodiment of the method, applying the negative voltage or the radio frequency pulse to the electrode chuck includes applying 30% to 50% of power applied during a normal etching procedure of the etching apparatus. In an embodiment, applying the negative voltage or the radio frequency pulse to the electrode chuck includes applying the power for a duration of about 10 seconds to about 60 seconds. In an embodiment of the method, each of the plurality of pins includes an electrically insulated cap in contact with the substrate. In an embodiment of the method, moving the plurality of pins includes moving the substrate a distance of about 1 mm to about 10 mm away from the surface of the electrostatic chuck. In an embodiment, the method further includes treating a backside of the at least one substrate with a coating for adhering the debris particles and/or contaminants. In an embodiment, the etching apparatus further includes a spectral and/or charge monitoring system. In an embodiment, the method further includes monitoring, via the spectral and/or charge monitoring system, surface charge saturation of the at least one substrate and/or composition of the debris particles and/or contaminants. In an embodiment, the method further includes turning off the plasma and discontinuing the negative voltage or the radio frequency pulse to the electrode chuck based on the surface charge saturation of the substrate and/or composition of the debris particles and/or contaminants. In an embodiment, the method further includes placing another substrate from the cassette on the electrostatic chuck, and turning on the plasma, thereby creating a positively charged surface on a surface of the another substrate. In an embodiment, the method further includes applying a negative voltage or a radio frequency pulse to the electrode chuck, thereby making residual debris particles and/or contaminants on, and/or in proximity, of the surface of the electrostatic chuck negatively charged and causing the residual debris particles and/or contaminants to attach to the positively charged surface of the another substrate.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
placing a substrate on a surface of an electrostatic chuck in a wafer processing apparatus, the electrostatic chuck comprising a plurality of pins that protrude therefrom, wherein the wafer processing apparatus includes a process chamber and a source of radio frequency power;
applying radio frequency power from the source of radio frequency power to the substrate to create a positively charged surface on the surface of the substrate;
applying a radio frequency pulse using the source of radio frequency power to the electrostatic chuck to make debris particles and/or contaminants on and/or in proximity of the surface of the electrostatic chuck negatively charged, the debris particles and/or contaminants attaching to the substrate; and
removing the substrate from the wafer processing apparatus thereby removing the debris particles and/or contaminants from the wafer processing apparatus.

2. The method of claim 1, wherein applying the radio frequency pulse to the electrostatic chuck includes applying 30% to 50% of power applied during a normal wafer processing procedure of the wafer processing apparatus.

3. The method of claim 2, wherein applying the radio frequency pulse to the electrostatic chuck includes applying the power for a duration of 10 seconds to 60 seconds.

4. The method of claim 1, wherein each of the plurality of pins includes an electrically insulated cap to electrically insulate the substrate from the electrostatic chuck.

5. The method of claim 1, further comprising:
moving the plurality of pins to move the substrate a distance of 1 mm to 10 mm away from the surface of the electrostatic chuck.

6. The method of claim 1, wherein the substrate comprises a coating on its backside that adheres the debris particles and/or contaminants during the attaching.

7. The method of claim 6, further comprising:
heating the substrate to melt or chemically activate the coating and thereby adhere the debris particles and/or contaminants to the coating; and
removing the heat to harden the coating to remove the debris particles and/or contaminants from the wafer processing apparatus.

8. The method of claim 1, further comprising:
monitoring, via a spectral and/or charge monitoring system, surface charge saturation of the substrate and/or composition of the debris particles and/or contaminants.

9. The method of claim 8, further comprising:
discontinuing the radio frequency pulse to the electrostatic chuck based on surface charge saturation of the substrate and/or composition of the debris particles and/or contaminants.

10. A method comprising:
placing a substrate on a surface of an electrostatic chuck of a wafer processing apparatus, the electrostatic chuck having a plurality of pins;
moving the plurality of pins to separate the substrate from the surface of the electrostatic chuck;
apply plasma to create a positively charged surface on the surface of the substrate;
apply a negative voltage to the electrostatic chuck and thereby making debris particles and/or contaminants on and/or in proximity of the surface of the electrostatic chuck negatively charged;
attaching the debris particles and/or contaminants to the substrate;
transferring the debris particles and/or contaminants to the surface of the electrostatic chuck;
removing the substrate from the surface of the electrostatic chuck; and
etching the debris particles and/or contaminants from the surface of the electrostatic chuck.

11. The method of claim 10, further comprising:
attaching the debris particles and/or contaminants to a film disposed on a backside of the substrate;
heating the substrate to an elevated temperature to melt and/or chemically activate the film on the substrate backside; and
transferring the film from the substrate to the surface of the electrostatic chuck.

12. The method of claim 11, wherein heating the substrate includes heating the substrate using a plasma having a density lower than the plasma used for removing the debris particles and/or contaminants.

13. The method of claim 11, wherein a temperature of the electrostatic chuck during the heating of the substrate is higher than a temperature of the film.

14. The method of claim 10, further comprising:
further applying plasma to etch the debris particles and/or contaminants; and
applying voltage of reverse polarity to the electrostatic chuck during further application of the plasma.

15. The method of claim 14, further comprising:
after further applying the plasma, venting the wafer processing apparatus to a pressure of greater than about 400 mTorr; and
after venting, applying a vacuum to further remove residual portions of the debris particles and/or contaminants from the electrostatic chuck.

16. The method of claim 10, wherein the electrostatic chuck comprises a plurality of pins disposed therein and each of the plurality of pins includes an electrically insulated cap to electrically insulate the substrate from the electrostatic chuck.

17. The method of claim 16, further comprising:
monitoring, via a spectral monitoring system, composition of the debris particles and/or contaminants.

18. A method of operating a wafer processing apparatus, the method comprising:
positioning a substrate on an electrostatic chuck in a process chamber;
moving the substrate away from the electrostatic chuck using a plurality of pins disposed in the electrostatic chuck;
applying plasma using a source of radio frequency power to create a positively charged surface on a surface of the substrate;
applying a radio frequency pulse from the source of radio frequency power to make debris particles and/or contaminants on and/or in proximity of the surface of the electrostatic chuck negatively charged;
attracting the debris particles and/or contaminants to the positively charged surface of the substrate, the debris particles and/or contaminants attaching to the positively charged surface of the substrate;
monitoring a surface charge level and/or composition of debris particles and/or contaminants on the surface of the electrostatic chuck;
stopping the plasma and discontinuing the radio frequency pulse to the electrostatic chuck based on a surface charge saturation of the substrate and/or composition of the debris particles and/or contaminants; and
removing the debris particles and/or contaminants adhered to the substrate by removing the substrate from the process chamber.

19. The method of claim 18, further comprising:
venting the wafer processing apparatus to a pressure of greater than about 400 mTorr; and
after venting, applying a vacuum to further remove residual portions of the debris particles and/or contaminants from the electrostatic chuck.

20. The method of claim 18, wherein applying the radio frequency pulse to the electrostatic chuck includes applying the power for a duration of at least 10 seconds.

* * * * *